United States Patent [19]

Chuss et al.

[11] 4,071,944
[45] Feb. 7, 1978

[54] ADHESIVELY AND MAGNETICALLY HOLDING AN ARTICLE

[75] Inventors: John T. Chuss, Whitehall; Henry H. Krechel, Kunkletown; Joseph R. Purvis, Whitehall, all of Pa.

[73] Assignee: Western Electric Co., Inc., New York, N.Y.

[21] Appl. No.: 624,137

[22] Filed: Oct. 20, 1975

[51] Int. Cl.² .............................................. B01J 17/00
[52] U.S. Cl. ........................................ 29/574; 29/590; 427/8; 427/47; 427/82; 427/128; 156/155; 156/344
[58] Field of Search ................ 427/8, 47, 128, 132, 427/82, 130; 156/344, 155, 64; 29/574, 590; 269/321 A, 321 W, 321 WE; 134/40

[56] References Cited

U.S. PATENT DOCUMENTS

| 3,555,659 | 1/1972 | Mracek | 29/421 |
| 3,635,730 | 1/1972 | Sweitzer | 427/47 |
| 3,652,075 | 3/1972 | Thompson | 269/21 |
| 3,681,139 | 8/1972 | Jannett | 156/344 |
| 3,765,431 | 10/1973 | Jannett | 134/113 |
| 3,783,499 | 1/1974 | Hughes | 29/574 |
| 3,793,706 | 2/1974 | Dohlen | 269/321 WE |
| 3,809,233 | 5/1974 | Gruszka | 206/328 |
| 3,847,697 | 11/1974 | Baker | 156/155 |
| 3,850,721 | 11/1974 | Schubert | 134/40 |
| 3,894,633 | 7/1975 | Egan | 156/584 |
| 3,899,379 | 8/1975 | Wanesky | 156/155 |
| 3,915,784 | 10/1975 | Makhijani | 156/344 |

OTHER PUBLICATIONS

Bachman et al., "Method of Aligning...Wafer", Western Electric, Technical Digest No. 33, pp. 5-6, (Jan. 1974).

*Primary Examiner*—Ralph S. Kendall
*Attorney, Agent, or Firm*—R. Y. Peters

[57] ABSTRACT

In fabrication of articles, such as semiconductor devices, the articles are adhered to the surface of a magnetized carrier having grooves with a suitable adhesive. Preferably, the grooves are parallel and in sets which intersect each other. The articles are made susceptible to the attraction of a magnetic field. The adhesive is removed by the flow of solvent vapor and liquid through the grooves while the articles are retained in their original position by magnetic forces.

In an alternate method, the articles may be adhered initially to a nonmagnetic substrate, made susceptible to the attraction of magnetic field and transferred to a grooved, magnetized carrier. Any adhesive which clings to the articles is removed by solvent vapor and liquid as before.

4 Claims, 6 Drawing Figures

ADHESIVELY AND MAGNETICALLY HOLDING AN ARTICLE

BACKGROUND OF THE INVENTION

1. Field of the Invention

The invention relates to methods of holding an article and, more particularly, to methods of holding semiconductor chips with grooved magnetic carriers.

2. Description of the Prior Art

In the manufacture of beam-lead semiconductor devices, wafers (slices) of semiconductor material are subjected to numerous photoresist, mask, etch, diffusion and metallization operations which form a large number of the devices in the wafer. The wafers are made fairly thick, about 0.020 inches, in order to withstand handling during this processing. Further, the devices are generally formed with their leads interleaved in order to obtain the maximum number of devices from the wafer. This precludes scribing and breaking the wafer into separate devices. Instead, the wafer is cemented to a support, often a sapphire disc, with wax or polypropylene; thinned to about 0.002 inches by lapping; masked to protect the bodies of the devices; and then selectively etched to yield an array of separate devices still adhered to the support.

The devices must be kept in the precise array and orientation in which they were formed for accurate bonding to the circuits in which they will be used but the adhesive must be removed so that it will not interfere with the bonding.

Jannett et al., U.S. Pat. No. 3,681,139 solve this problem by placing a magnetic grid over the devices, to maintain their orientation, and supporting them on a porous or perforated magnetic block having mesas. The adhesive is dissolved while the devices are retained by the magnetic grid. The solvent flows between the mesas to remove adhesive adhering to the underside of the devices. However, in order to remove the grid to get at the devices without losing their orientation and position, vacuum must be applied through the perforations or porous support. That is, from this point on until they are bonded to their circuits, the devices must be held to the support by vacuum.

The inconvenience of the grid frame and the vacuum may be overcome by the methods of Gruszka, U.S. Pat. No. 3,809,233 or Hughes, Jr. et al., U.S. Pat. No. 3,783,499 which use a magnetized support or carrier plate in conjunction with a magnetic device. But the surface of the support is not channeled. As a result the solvent cannot readily flow beneath the devices to remove the adhesive without moving or shifting the devices. Gruszka adds a porous magnetic cover to prevent shifting and Hughes et al. do not mention solvent removal of the adhesive.

SUMMARY OF THE INVENTION

Accordingly, it is an object of the invention to provide new and improved methods for holding articles. It is another object to provide new methods for holding articles while removing material therefrom, in such a way that their location and orientation is maintained.

These and other objectives are accomplished by adhering the articles to a magnetized carrier with a suitable adhesive and selectively adding a magnetic material to each article. The surface of the carrier, to which the articles are adhered is grooved with channels and the adhesive is removed by solvent flow through the channels or grooves.

In an alternative method, the articles are initially adhered to a nonmagnetic support with a suitable adhesive, magnetic material is added, and the articles transferred to a grooved, magnetized carrier. Any adhesive which clings to the articles is removed with solvent vapor and solvent as before.

BRIEF DESCRIPTION OF THE DRAWINGS

Other objects and features of the invention will be more readily understood from the following detailed description of specific embodiments thereof, when read in conjunction with the accompanying drawings in which.

DETAILED DESCRIPTION

Figure 1:
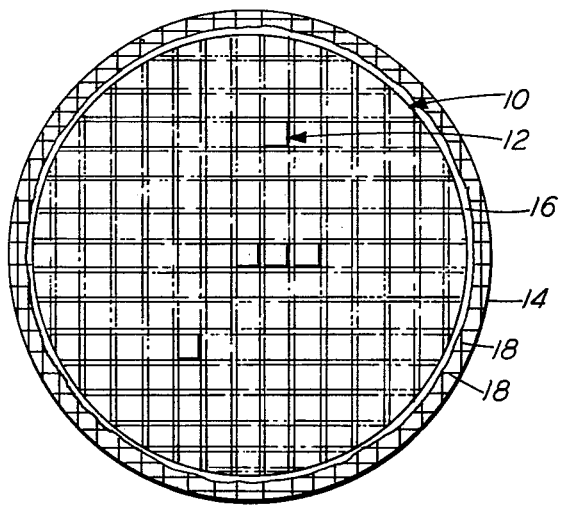
FIG. 1 is a plan view of a wafer adhered to a grooved, magnetized carrier.

Referring now to FIG. 1, a slice or wafer 10 of semiconductor material, such as silicon, contains an array of semiconductive devices 12, such as capacitors or integrated circuits, only a few of which are shown. The wafers are about 0.002 inches thick and about 2 inches in diameter and the devices 12 have been formed on one side, called the active side, of the wafer 10 by prior operations of masking, etching, diffusing and metallizing, all of which are well known in the art.

The wafer 10 is adhered to a carrier 14, with the active side against the carrier, by means of an adhesive 16. The adhesive 16 may be, for example, one of the type sold by the Biwax Corporation, DesPlaines, Illinois, under the trade designation B-7050 or polypropylene sold by the Eastman Chemical Products, Inc., Kingsport, Tenn. under the trade designation "Epolene" M-5W Polymer.

The carrier 14 is somewhat larger in diameter than the wafer 10, is about 0.2 inches thick and is made of magnetically hard material. Any material which may be permanently magnetized, such as the barium and strontium ferrites and the alnico series of alloys, may be used, but it is not the intention to limit the invention to just these materials. The surface of the carrier 14 is channeled, refer to FIG. 2, with grooves 18 one set being at an angle to the other. Preferably, the grooves are parallel and one set is normal, i.e., 90°, to the other. The grooves may be about 0.006 inches wide by about 0.005 inches deep spaced on 0.025 inch centers.

The carrier 14 is magnetized transversely to the grooved surface and the magnetic poles are formed on 0.025 inch centers in accordance with H. E. Hughes, Jr. et al., U.S. Pat. No. 3,783,499 which is incorporated herein by reference. Preferably, the carrier 14 should be magnetized so that the maximum pole strength occurs between the channels.

The wafer 10 is thinned to about 0.002 inches thick and is then separated into individual devices 12 by masking the wafer with photoresist to define a body 20 of each device and etching the wafer material away between the bodies. This exposes leads 22 and yields the separated devices 12 still adhered to the carrier 14 by adhesive 16. Photoresist masking and etching are well known in the art and are fully described in numerous sources, e.g., Berry, Hall and Harris, *Thin Film Technology*, New York, D. VanNostrand Co. (1968) pp. 419–466.

Figure 2:
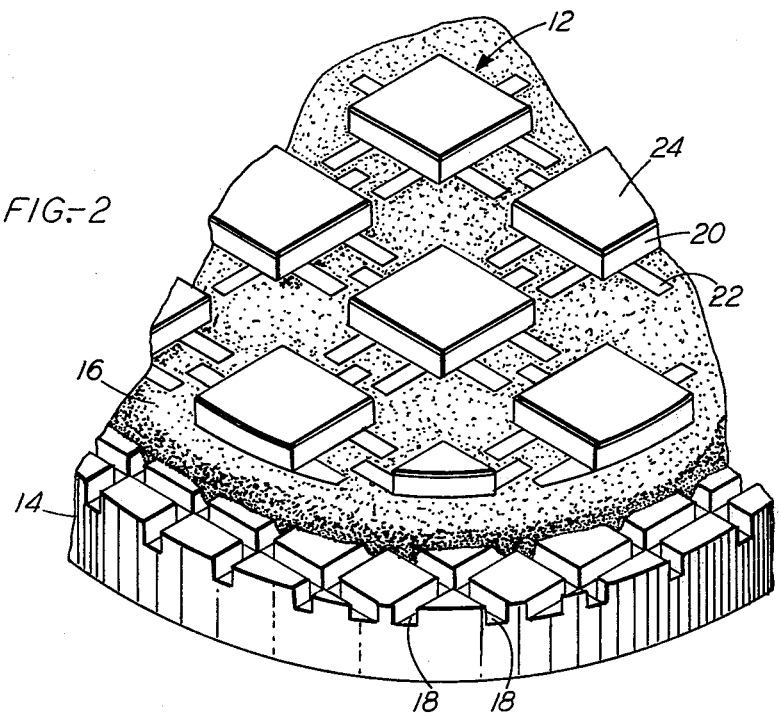
FIG. 2 is an enlarged isometric view of a portion of the carrier with the wafer separated into devices and magnetic material applied to the surface of the devices.
Figure 3:
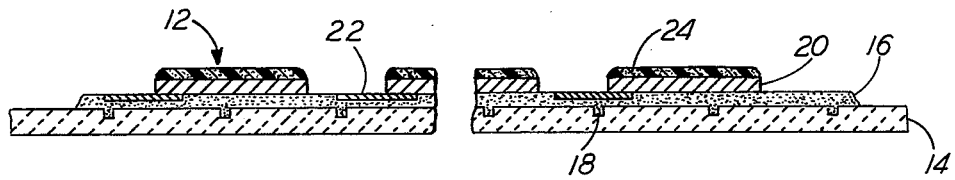
FIG. 3 is a cross section of a carrier and devices with magnetic material applied.

Referring now to FIGS. 2 and 3, a magnetically soft material 24 is applied to each body 20 to make the devices 12 magnetic so that they will be attracted to and held by a magnetic field. The magnetic material 24 may be an epoxy or phenolic resin magnetic ink having about 40% magnetic particles dispersed therein, such as the magnetic ink sold by the Markem Company under the trade designation 7257-H-6A. Preferably, the ink is applied by silk screening methods well known in the art. Alternatively, a magnetically soft metal, such as permalloy, may be selectively deposited on the thinned wafer prior to etching the wafer into the individual devices 12.

Figure 4:
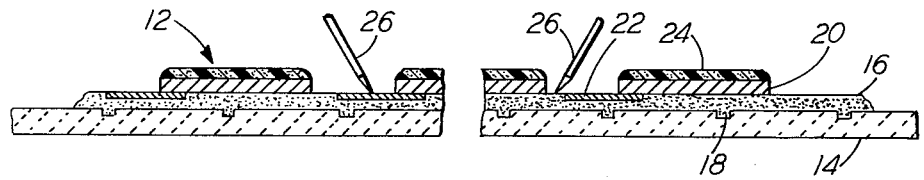
FIG. 4 is a cross section of a carrier with test probes in position for measuring electrical characteristics.

Referring now to FIG. 4, which is an enlarged partial cross section, the devices 12 are tested by contacting the leads 22 with probes 26. If the magnetic material 24 is an epoxy or a phenolic resin it must be cured. Since the heat of fully curing such an epoxy may cause the adhesive to run over the leads and interfere with testing, it is partially cured at a low temperature before testing and completely cured after testing. The testing permits those devices having desired characteristics to be identified.

Once the devices have been identified, they must be freed so that they may be removed from the carrier 14. That is, the adhesive must be removed. Also, since the devices 12 will be thermocompressively bonded to their circuit, it is necessary to remove all signs of adhesive from the bottom surfaces of the leads 22. Further, the location and orientation of the devices 12 must not be disturbed in doing so because subsequent pick up and application to the circuits to which the devices 12 are bonded is semiautomatic or automatic. Success or failure depends on maintaining the accuracy of location and orientation on the carrier.

The adhesive 16 is removed by dissolving it in a suitable solvent, such as trichloroethylene or the like. Preferably, the solvent is heated to produce the vapor and the carrier 14 is placed in the vapor so that the vapor penetrates, condenses, and dissolves the adhesive 16. The vapor and solvent are able to act on the adhesive and work their way under the devices 12 much faster with the grooves than without them. Such speed is a great advantage in commercial manufacture where time is of the essence. Further, since the grooves provide space for the liquid solvent, the liquid can run off without moving the devices 12 out of position. Finally, much better adhesive removal is obtained when vapor and solvent can readily flow beneath the devices.

Once the adhesive 16 has been removed, the devices 12 may be transported to subsequent manufacturing operations or covered and shipped to customers in accordance with R. F. Gruszka, U.S. Pat. No. 3,809,233.

Alternate Method

Figure 5:
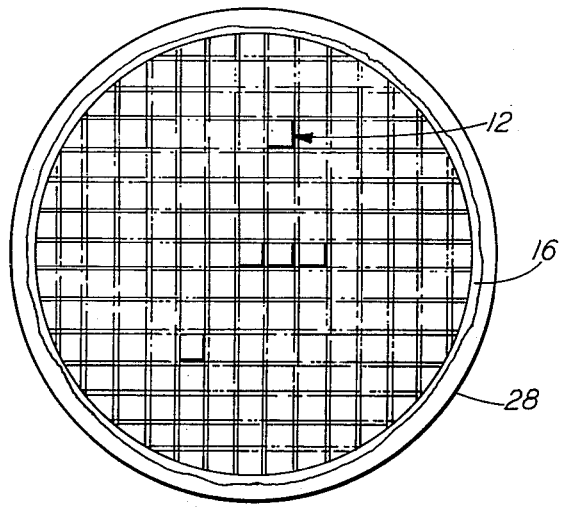
FIG. 5 is a plan view of a wafer adhered to a nonmagnetic support and separated into individual devices.

Referring now to FIG. 5, if for some reason it is necessary or desirable to start the manufacture of the devices 12 by adhering the wafer 10 to a nonmagnetic support, the wafer may be adhered to a support 28 of, for example, ceramic, glass or sapphire. The wafer 10 is processed as before by thinning it to about 0.002 inches thick; masking and etching it to form the individual devices 12; selectively applying the magnetic material to the bodies of the devices 12; partially curing the material, if it is an epoxy; electrically testing each device 12 and completing the curing.

To free the devices 12 from the adhesive, solvent is applied to the exposed adhesive 16 to remove most of it and make it easier for sorting apparatus to remove devices from the support. The support 28 is then placed on a sorting apparatus, such as that disclosed in J. J. Egan et al., U.S. Pat. No. 3,894,633 and which is incorporated herein by reference.

Figure 6:
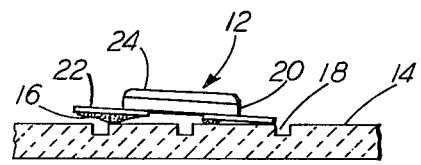
FIG. 6 is a portion of a cross section of a grooved magnetic holding a device which has been transferred from a nonmagnetic carrier.

The support 28 of the present invention is positioned in the place of carrier 28 of J. J. Egan et al. and carrier 14 of the present invention is substituted for the carrier 36 of J. J. Egan et al. The devices having the desired characteristics are then transferred from the support 28 to the carrier 14. In this process some adhesive 16 may be carried over, refer to FIG. 6, and this must be removed.

The adhesive 16 is removed by flowing a suitable solvent through the grooves 18, as before, while the devices 12 are retained in position by the magnetic forces.

While there has been described and illustrated herein practical embodiments of the present invention, it is to be understood that various modifications and refinements which depart from the disclosed embodiment may be adopted without departing from the spirit and scope of the present invention.

What is claimed is:

1. A method of holding a wafer of semiconductor material having an array of semiconductor devices formed therein, which comprises the steps of:
    adhering the wafer to a magnetized carrier with an adhesive, the carrier having intersecting sets of parallel grooves and material selected from the group consisting of barrium ferrite, strontium ferrite, alnico, or a mixture of barrium and strontium ferrite;
    separating the wafer into individual devices;
    screening magnetic ink on the individual devices;
    partially curing the ink;
    electrically testing the devices;
    completing the curing of the ink; and
    placing the carrier in trichlorethylene solvent vapor and condensing the vapor to form the liquid solvent thereon, the solvent flowing over the surface and through the grooves in the carrier to rapidly and completely remove the adhesive from beneath the devices while the magnetic forces maintain the location and orientation of the devices on the carrier.

2. The method of claim 1 wherein the partial curing of the ink is done by heating it at a temperature which is sufficiently low to avoid melting the adhesive while still being able to partially cure the ink.

3. A method of handling a wafer of semiconductor material having an array of semiconductor devices formed therein, wherein the wafer has been adhered to a nonmagnetic support with an adhesive, which comprises the steps of:
    separating the wafer into individual devices;

screening magnetic ink on the individual devices to make them magnetic;

partially curing the ink;

electrically testing the devices to determine the good ones;

completing the curing of the ink;

dissolving a portion of the adhesive;

melting the remaining adhesive to free the devices from the magnetic support;

transferring the devices to a magnetized carrier, the carrier having intersecting sets of parallel grooves and material selected from the group consisting of barrium ferrite, strontium ferrite, alnico, or a mixture of barrium and strontium ferrite; and placing the carrier in trichloroethylene solvent vapor and condensing the vapor to form the liquid solvent thereon, the solvent flowing over the surface and through the grooves in the carrier to rapidly and completely remove any adhesive transferred with the devices while the magnetic forces maintain the location and orientation of the devices on the carrier.

4. The method of claim 3, wherein the partial curing of the ink is done by heating it at a temperature which is sufficiently low to avoid melting the adhesive while still being able to partially cure the ink.

* * * * *